(12) United States Patent
Rossi et al.

(10) Patent No.: US 8,543,344 B2
(45) Date of Patent: Sep. 24, 2013

(54) POWER METER ARRANGEMENT

(75) Inventors: Sergio Rossi, Genoa (IT); Kurt Marquardt, Munich (DE); Sandro Cerato, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 175 days.

(21) Appl. No.: 12/974,572

(22) Filed: Dec. 21, 2010

(65) Prior Publication Data

US 2012/0159641 A1    Jun. 21, 2012

(51) Int. Cl.
*G01R 21/00* (2006.01)
*G06F 7/04* (2006.01)

(52) U.S. Cl.
USPC ............................................. 702/61; 726/27

(58) Field of Classification Search
USPC .......................................... 726/27; 713/156
See application file for complete search history.

(56) References Cited

U.S. PATENT DOCUMENTS

| | | | |
|---|---|---|---|
| 5,715,390 A | 2/1998 | Hoffman et al. | |
| 6,000,034 A | 12/1999 | Lightbody et al. | |
| 6,633,823 B2 * | 10/2003 | Bartone et al. | 702/57 |
| 7,289,887 B2 * | 10/2007 | Rodgers | 700/295 |
| 7,761,910 B2 * | 7/2010 | Ransom et al. | 726/6 |
| 7,979,221 B2 * | 7/2011 | Gilbert et al. | 702/61 |
| 8,032,233 B2 * | 10/2011 | Forbes et al. | 700/22 |
| 8,126,685 B2 * | 2/2012 | Nasle | 703/4 |
| 2004/0193329 A1 | 9/2004 | Ransom et al. | |
| 2007/0067121 A1 * | 3/2007 | Przydatek et al. | 702/57 |
| 2010/0306533 A1 * | 12/2010 | Phatak | 713/156 |
| 2011/0010547 A1 * | 1/2011 | Noda | 713/168 |
| 2011/0093396 A1 * | 4/2011 | Parkos et al. | 705/63 |
| 2011/0317834 A1 * | 12/2011 | Chaturvedi et al. | 380/255 |
| 2012/0050064 A1 * | 3/2012 | Husney | 340/870.02 |
| 2012/0078548 A1 * | 3/2012 | Salazar et al. | 702/62 |

OTHER PUBLICATIONS

European Search Report, Application Serial No. 11192467.6-2213, Infineon Technologies AG, mailed Oct. 8, 2012, 7 pages.

* cited by examiner

*Primary Examiner* — Nathan Flynn
*Assistant Examiner* — Abdullah Almamun
(74) *Attorney, Agent, or Firm* — Slater & Matsil, L.L.P.

(57) ABSTRACT

An electric power meter arrangement, includes a metrology unit configured to be coupled to a power line and to determine power consumption and provide measurement data representing the power consumption. A programmable control unit including a memory is configured to store software configured to run on the control unit. A security unit is configured to store at least one key and to validate that software stored in the memory of the programmable control unit is authorized.

17 Claims, 6 Drawing Sheets

POWER METER ARRANGEMENT

TECHNICAL FIELD

Embodiments of the present invention relate to an electric power meter arrangement, for example, a smart electric power meter arrangement.

BACKGROUND

An electric power meter is adapted to measure the power consumption of electric loads connected to a power supply line. The power meter is coupled to the supply line and measures the voltage at the supply line and the current flowing through the supply line in order to determine the power consumption.

A conventional electromechanical power meter includes a non-electronic display that displays the power that has been consumed since the power meter has been installed. An employee of the utility company regularly (usually a few times each year) evaluates the meter reading in order to calculate the power consumption since the last evaluation and in order to bill the customer accordingly.

A smart electric power meter is an electronic device that is coupled to the power line and that is adapted to measure the power consumption and to store a measurement value representing the power consumption in a memory device. The memory can be read out on-site. Alternatively, the smart meter may have an interface which connects the smart meter to a communication network. Via the network the utility company can read the memory so that there is no need to have an employee on-site. The network can be any suitable network, like a wireless network, a telephone network, or a power line.

Power consumption data, especially when they are transmitted to the utility company, are sensitive data, because they allow conclusions to be drawn based on the consumer's habits and could, therefore, be abusively used for surveillance purposes by unauthorized third parties that may "eavesdrop" on the network. In addition, power consumption data may be tampered with by the consumer in order to reduce electricity bills.

Some smart power meters include a switching arrangement (circuit breaker) which can be remotely operated by the utility company in order to interrupt the power supply when, for example, the customer does not pay the bill or is consuming an excess of power. It goes without saying that unauthorized operation of the circuit breaker may have severe consequences for the consumer, but also on the stability of the grid.

SUMMARY OF THE INVENTION

In one embodiment, the present invention provides a secure and tamper-proof meter.

In a first aspect an electric power meter arrangement, including a metrology unit is configured to be coupled to a power line in order to determine power consumption and to provide measurement data representing the power consumption. A programmable control unit including a memory is configured to store software configured to run on the control unit. A security unit is configured to store at least one key and to validate that software stored in the memory of the programmable control unit is authorized.

BRIEF DESCRIPTION OF THE DRAWINGS

Examples will now be explained with reference to the drawings. The drawings serve to illustrate the basic principles, so that only aspects necessary for understanding the basic principles are illustrated. The drawings are not to scale. In the drawings the same reference characters denote like features.

DETAILED DESCRIPTION OF ILLUSTRATIVE EMBODIMENTS

Figure 1:
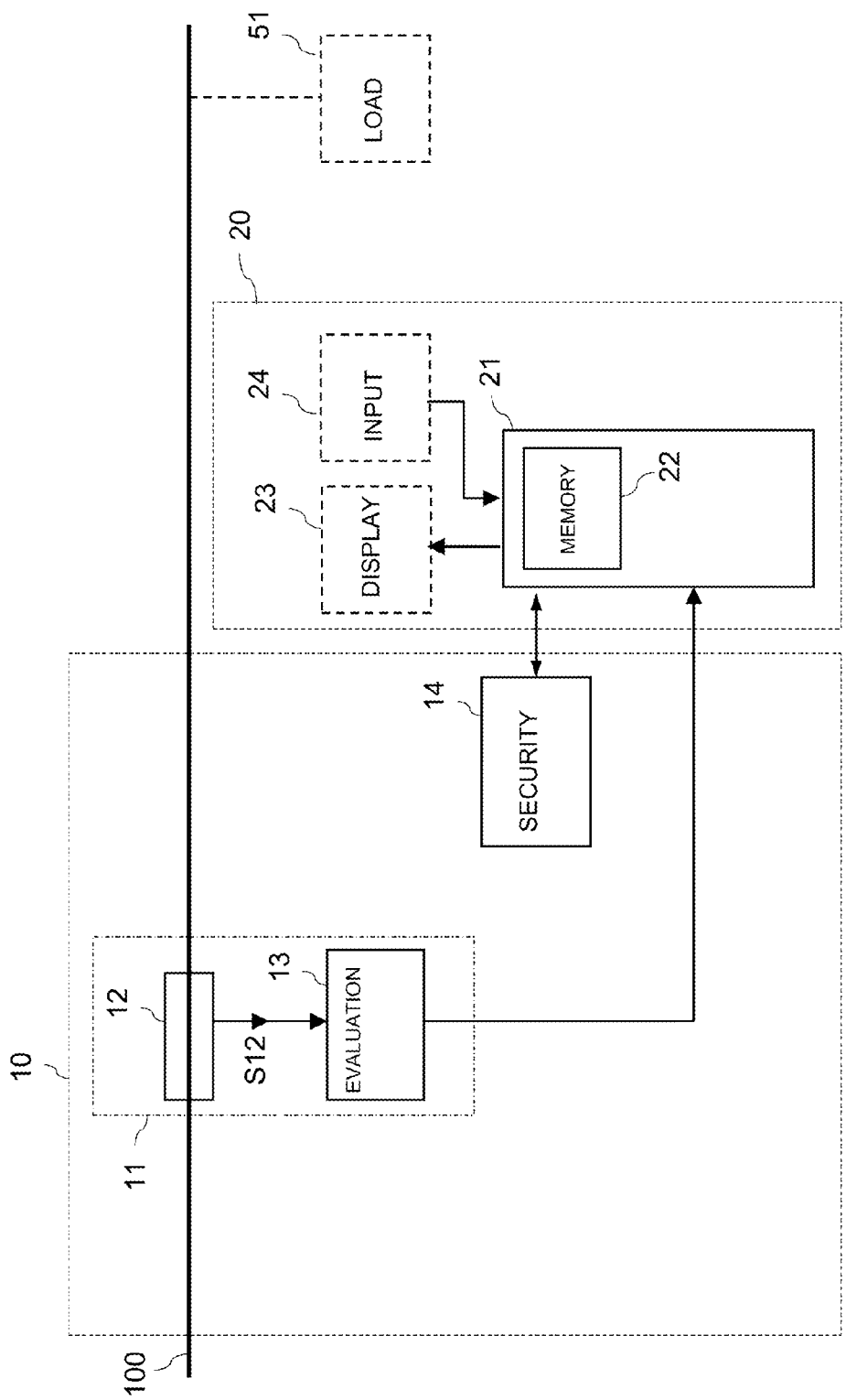
FIG. 1 illustrates a block diagram of a power meter arrangement according to a first embodiment, which includes a metrology unit, a control unit and a security unit.

FIG. 1 shows a block diagram which illustrates a first embodiment of an electric power meter arrangement, in particular, a smart power meter arrangement. The power meter arrangement includes a metrology unit 11 which is configured to be coupled to a power line 100 and to determine a power consumption or, more precisely, an electrical energy consumption. The metrology unit 11 measures the electrical energy transferred via the power line 100. This can be electrical energy transferred from a supplier (not shown), like a utility company, to a consumer or, more precisely, to electrical loads 51 (illustrated in dashed lines) connected to the power line 100 and operated by the user. However, this can also be energy transferred in an opposite direction from the consumer to the supplier when, e.g., the consumer operates current generating means, like solar panels.

The metrology unit 11 includes, for example, a sensing device 12 coupled to the power line 11 and configured to provide a measurement signal S12 to an evaluation unit 13. The measurement signal S12 represents at least the current flowing through the power line 11, but may also include two sub-signals from which one represents the current flowing through the power line 100, and one represents the voltage available at the power line 100. The evaluation unit 13 is configured to calculate the power consumption from the current signal or from the current and the voltage signal. According to the first alternative, the evaluation unit 13 calculates the effective current (rms current) from the measured current and calculates the power consumption based on the effective current and the known (and usually only slightly varying) rms value of the voltage at the power line 100. According to the second alternative, the evaluation and storage unit 13 takes into account both the measured current value and the measured voltage value for calculating the power consumption.

The evaluation unit 13 is further configured to meter the evaluated power consumption in order to provide measurement data representing the accumulated power consumption, which is the electrical energy transferred via the power line 100. The measurement data represent the energy consumed since a given time in the past. For example, this time can be the time at which the power meter has been installed, or the time at which the measurement data have been read out from the metrology unit 11 for the last time.

Optionally, the metrology unit 11 is configured to store several measurement data (power meter readings), with each of these measurement data representing the accumulated power consumption (energy consumption) at another time in the past. These measurement data provide a power consumption history which not only allows the determination of the absolute energy consumption, but also allows the evaluation of fluctuations in the power consumption. Storing a history of power meter readings provides additional information, like the information at which times the power consumption was relatively high or relatively low.

The metrology unit 11 with the sensing device 12 and the evaluation unit 13 can be a conventional smart power meter metrology unit. Such metrology units are commonly known, so that no further explanations are required in this regard.

In FIG. 1 only one power line 100 is illustrated. However, the power meter arrangement can be connected to more than one power line, like three power lines in a three-phase power system. In this case the power meter arrangement includes three sensing devices 12 which provide their sensing signals to the evaluation unit 13.

The power meter arrangement further includes a control unit 20. The control unit 20 is configured to communicate with the metrology unit 11 such that the control unit 20 may receive data, like measurement data, from the evaluation unit 13 and/or that the control unit 20 may provide data, like data for resetting the metrology unit 11 after the measurement data have been retrieved, to the metrology unit 11. A communication link between the control circuit 20 and the metrology unit 11 can be implemented in a conventional way with a direct link (as illustrated) between these two units 11, 20, or with a bus (not illustrated) which could also be used for data transmission to other units within the power meter arrangement.

The control circuit 20 includes a programmable device 21 with a memory 22, in particular, a non-volatile memory, in which a software program can be stored. The programmable device 21 can be implemented with a microcontroller. According to one embodiment, the memory 22 is not only configured to store software, but is also configured to store measurement data retrieved from the metrology unit 11.

Optionally input/output means, like a display 23 and/or a keypad 24, are connected to the programmable device 21 in the control unit 20. The input/output means allow a user to retrieve information from the control unit 20, like measurement data stored in the programmable device 21 or evaluation data retrieved by the control unit 20 from the evaluation unit 13. Further, the display may be used to display tariff information or service information, like a meter serial number, etc.

The measurement data displayed by the control unit 20 may, for example, be read by a person authorized by the utility company and may form the basis for charging the consumer. It is, therefore, of utmost relevance that measurement data which are displayed by the control unit 20 or which are transmitted to the utility company by other means are correct. The data retrieved from the evaluation unit 13 and displayed by the control unit 20 or forwarded to the utility company are processed by the processing device 21 governed by the software stored in the memory 22. Assume that a third party with fraudulent intentions replaces this software or firmware with a tempered software or firmware that displays or forwards manipulated measurement data, e.g., data representing consumption lower than the real consumption. In this case a significant economic loss could be the consequence for the utility company.

To prevent the software stored in the control unit 20 from being tampered with or to detect a tampered software stored in the control unit 20, the power meter 10 includes a security unit 14 which is configured to validate that a software or firmware stored in the memory 22 of the programmable control unit 20 is authorized. The security unit 14 can be implemented as a hardware security module (HSM). According to one embodiment, the metrology unit 11 and the security unit 14 are implemented in a common module or housing (illustrated in dashed lines in FIG. 1). This module or housing 10 may include additional security means (not shown) like security switches which, for example, may disable the power meter in case the module or housing 10 is opened or is tried to be opened, or which alert the utility company.

Figure 2:
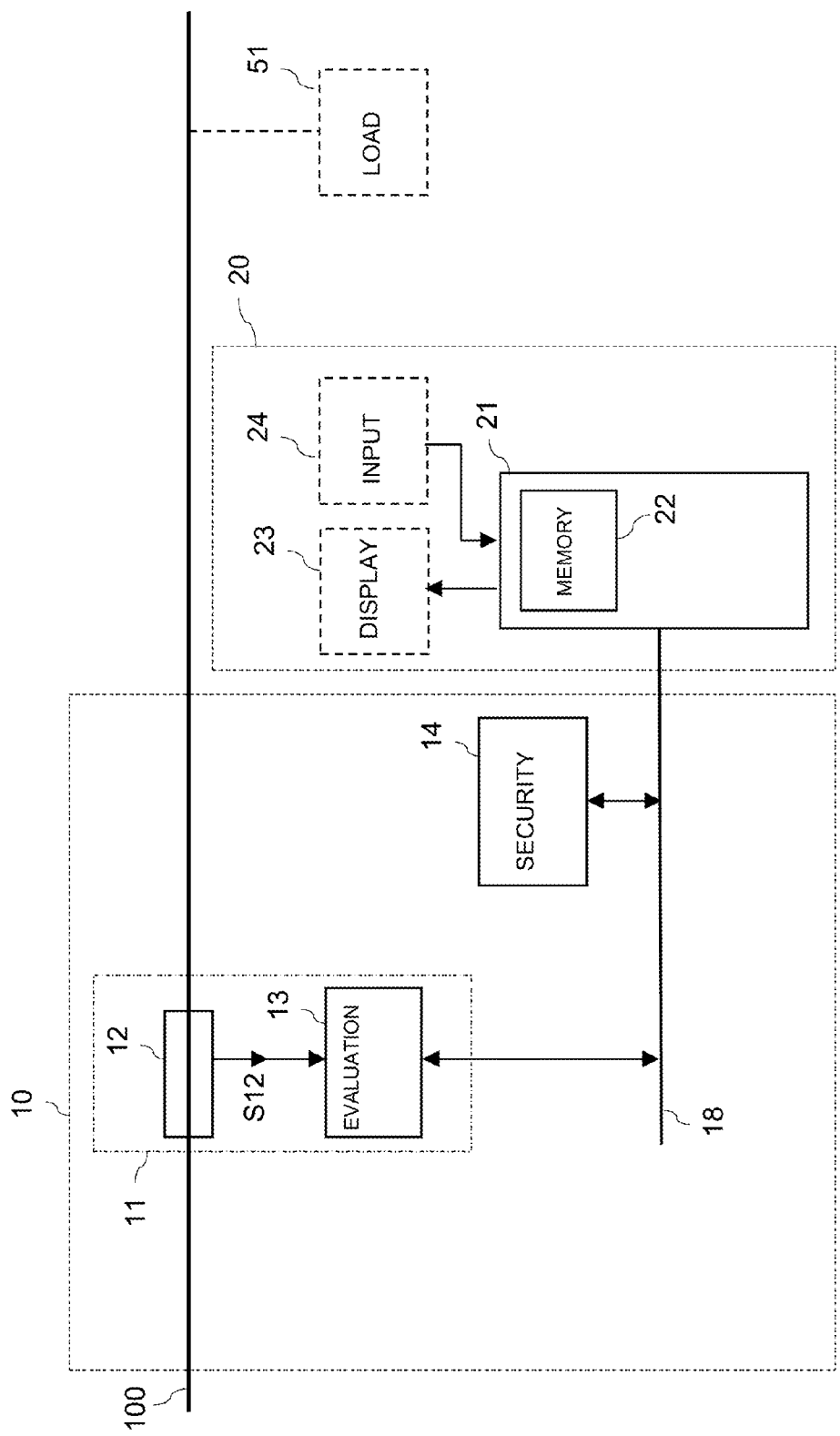
FIG. 2 illustrates a block diagram of a power meter arrangement according to a second embodiment.

The security unit 14 is coupled to the control unit 20 via a communication link. This communication link can be a dedicated communication link as illustrated in FIG. 1. According to a further embodiment, which is illustrated in FIG. 2, the power meter 10 includes a communication bus 18 to which the control unit 20, the metrology unit 11 and the security unit 14 are coupled and which allows a communication between these units.

Figure 3:
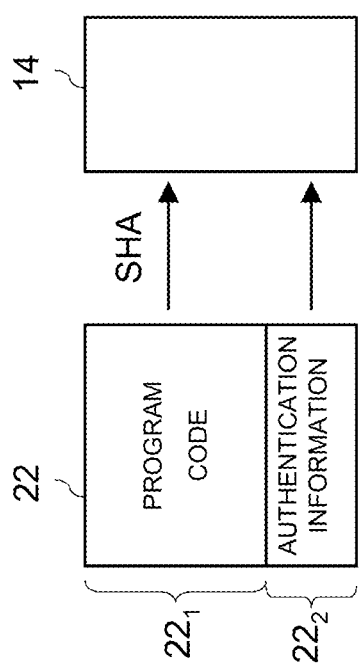
FIG. 3 illustrates one embodiment of a software authentication method which can be performed by the security unit.

Methods for software authentication are commonly known. Any of these conventional methods can be performed by the security unit 14 in order to verify that the software stored in the memory 22 is authenticated or authorized. One embodiment of a software authentication method, which may be implemented by the security unit 14 and the control unit 20, is schematically illustrated in FIG. 3. In this method, the memory 22 of the control unit 20 includes two memory sections: A first section $22_1$ in which a program code is stored; and a second section $22_2$ in which an authentication information is stored. The authentication information is, for example, an encrypted version of a checksum of the program code or of parts of the program code stored in the first section $22_1$. The checksum is, for example, obtained from the program code using secure hash algorithms (SHA), like SHA1 or SHA256. Secure hash algorithms are one way functions, so that based on the checksum the program code cannot be identified. The checksum stored in the second section $22_2$ is further encrypted using a first one of a pair of keys. A second one of this pair of keys is stored in the security unit 14 and allows the security unit 14 to decrypt the authentication information in order to retrieve the checksum. The first key is, a secret key only known to the utility and used to decrypt the checksum, whereas the second key is a public key. This second key can be stored in the security unit 14 or the control unit 20. The security unit 14 further applies the secure hash algorithm to the program code stored in the first section $22_1$ and compares the result of applying the hash algorithm to the program code with the checksum obtained by decrypting the authentication information. If the checksum equals the result of applying the hash algorithm, the software/firmware stored in the memory 22 is considered to be authorized. Again, the method illustrated in FIG. 3 is only one of a plurality of different methods for performing software authentication. Each of these other methods may be implemented in connection with the power meters illustrated in FIGS. 1 and 2 instead of the method illustrated in FIG. 3. If the result of the authentication process would be that the software stored in the memory is not authorized, it is discarded/deactivated according to one embodiment.

Figure 4:
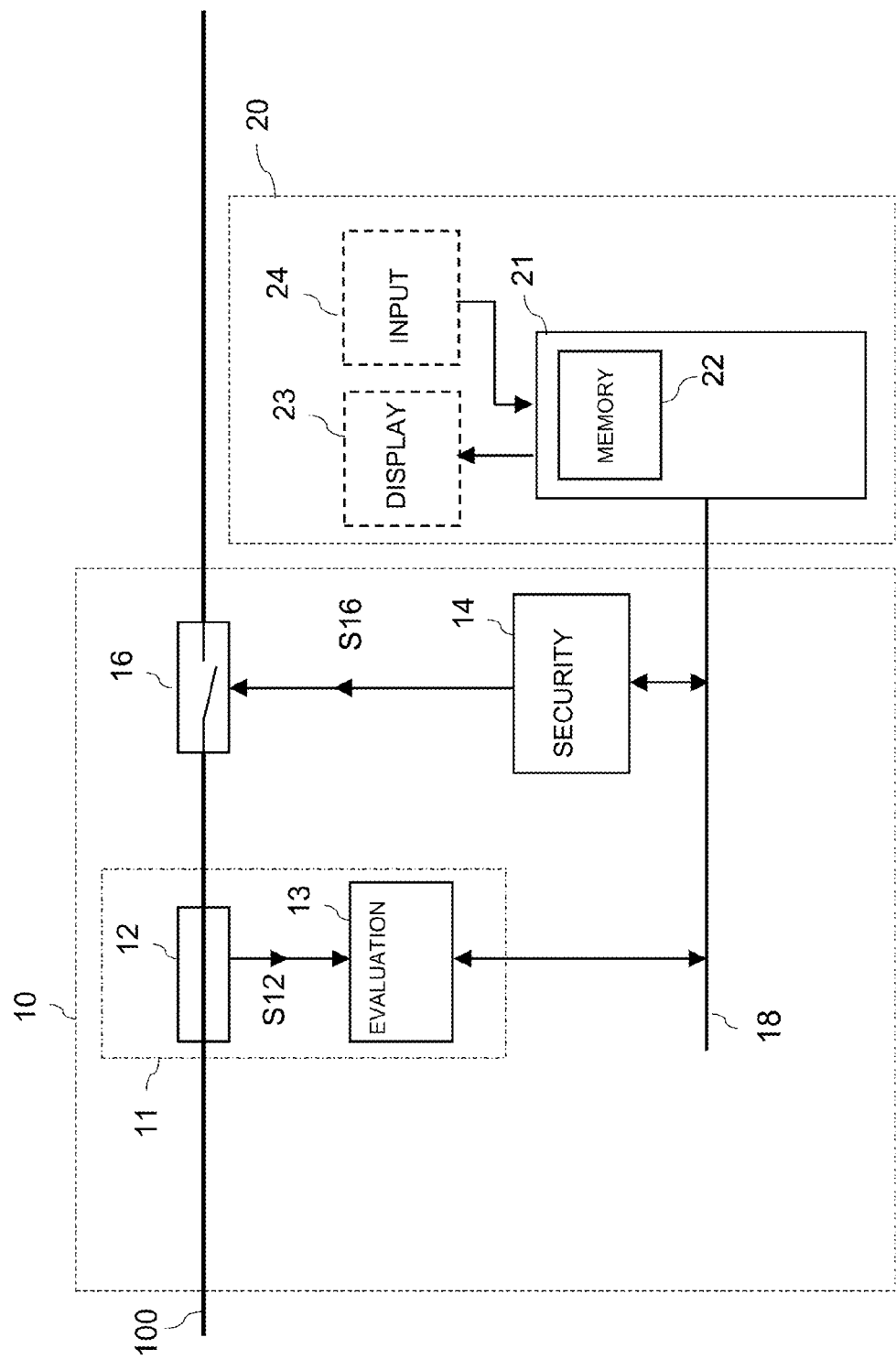
FIG. 4 illustrates an embodiment of an electric power meter arrangement which includes a switching circuit.

Referring to FIG. 4, the power meter 10 according to a further embodiment includes a switching circuit 16, also known as circuit breaker. The switching circuit 16 includes a switching element with a load path which is configured to be connected to the power line 100 or, more precisely, which is configured to be connected between two terminals of the power line 100. The switching circuit 16 receives a control or drive signal S16 at a control input and is configured to assume and latch an on-state or an off-state each time it is driven. In the on-state the switching circuit 16 allows a current to flow through the power line 100, while in the off-state the switching circuit 16 prevents a current to flow, i.e., interrupts the power line 100. The switching circuit 16 may include a conventional switching element, like a relay or a semiconductor power switch, and a drive circuit for driving the switching element dependent on the control or drive signal S16. Such switching circuits or circuit breakers are commonly known so that no further explanations are required in this regard.

In FIG. 1, only one power line is illustrated. Consequently, only one switching element of the switching circuit 16 is schematically illustrated in FIG. 4. Of course, the power meter can be connected to more than one power line, like three power lines in a three-phase power system. In this case, the switching circuit includes a number of switches corresponding to the number of power lines, wherein each of these switches is connected to one of the power lines. These several switches of the switching circuit can be controlled or driven commonly by the controller drive signal S16.

In the embodiment illustrated in FIG. 4, the drive signal S16 is provided by the security unit 14. In this embodiment, the switching circuit 16 is directly connected to the security unit 14. However, this is only an example. The security unit 14, and/or switching circuit 16 could also be connected to the signal bus 18 and could receive the drive signal S16 from the security unit 14 via the signal bus 18.

The security unit 14 might be, for example, configured to switch off the switching circuit 16 when it detects that a non-authorized software is stored in the control unit 20, i.e. after the software authentication process has failed.

Figure 5:
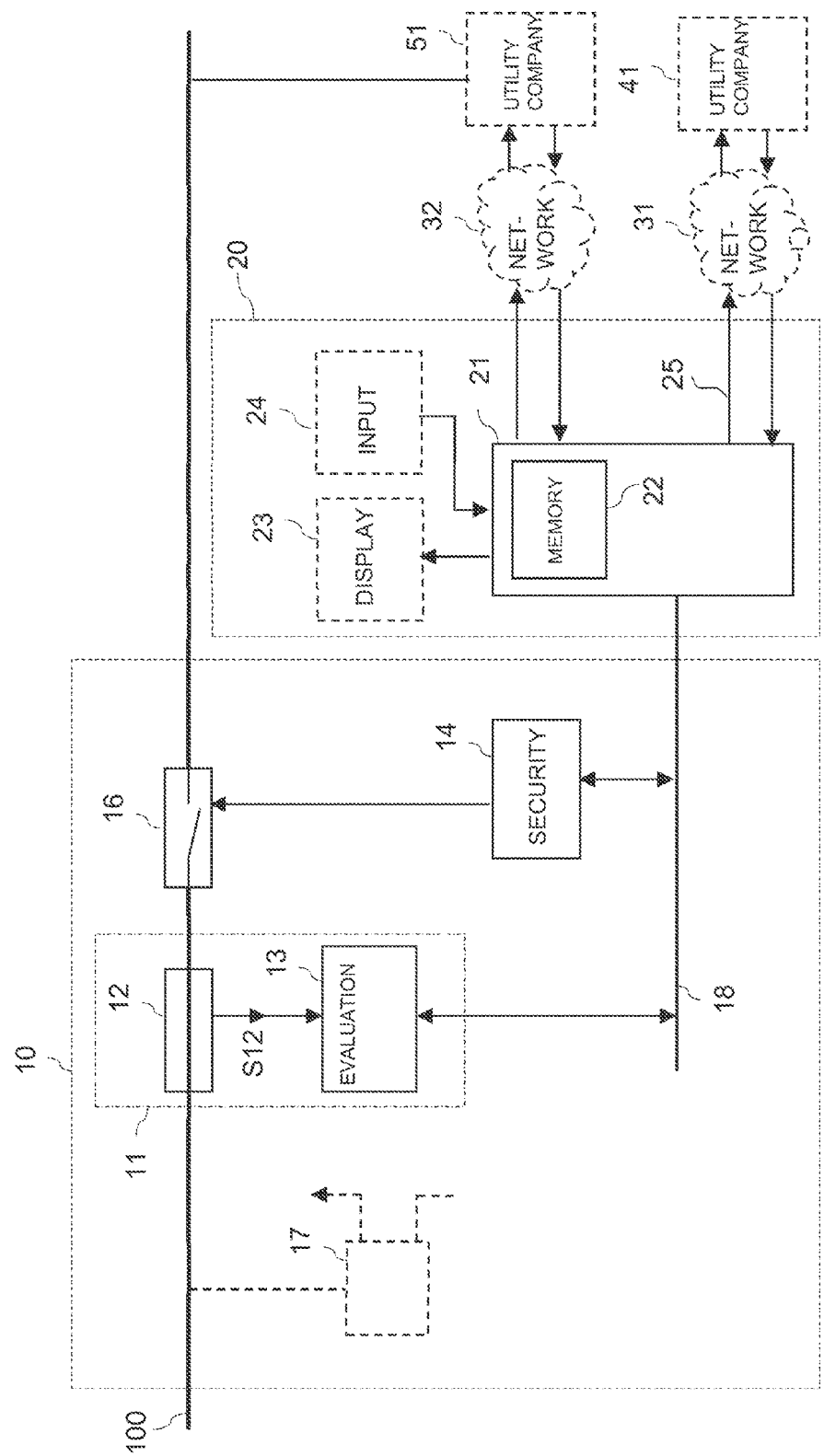
FIG. 5 illustrates an embodiment of an electric power meter arrangement in which the control circuit includes a communication interface for communication with a utility company.

FIG. 5 illustrates a further embodiment of a power meter 10. In this embodiment, the control unit 20 includes a first interface circuit 25 which is configured to connect the control unit 20 to a network 31. The first interface circuit 25 enables a data communication between the control circuit 20 and the electricity or utility company 41. The network 31 can be a conventional data communication network, like a telephone network, a wireless network, or a power line network adapted for power line communication.

A data communication between the control circuit 20 and the electricity company 41 can include: the transmission of power consumption data from the control unit 20 to the utility company 41 via the network 31; the transmission of software updates for the software stored in the memory 22 and running on the control unit 20; the transmission of control information (for the switching circuit 16, for example) or of control data (like tariff data, for example) from the utility company 41 via the network 31 to the control circuit 20. By means of the control information the utility company 41 may remotely actuate, i.e., switch on or off, the circuit breaker 16. Power consumption retrieved by the control unit 20 from the metrology unit 11 and transmitted via the network 31 to the utility company 41, allow the electricity company to bill the customer based on his energy consumption, wherein an on-site reading of the power consumption or energy consumption data is not required.

Figure 6:
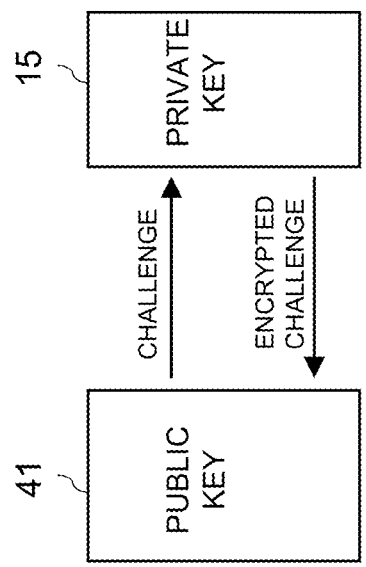
FIG. 6 illustrates one embodiment of a power meter authentication method performed by the utility company and the security unit.

Via the network 31 the utility company 41 can verify that the power meter 10 which communicates or which tries to communicate with the utility company 41 is a power meter authorized by the utility company 41 or by another trusted entity. An embodiment of a method for verifying whether the power meter 10 is an authorized power meter is schematically illustrated in FIG. 6. In this embodiment, the utility company 41 holds a public key selected from a pair of keys with a public key and a private key, and the security unit 14 of the power meter holds the corresponding private key 15. This pair of keys with can be generated in a conventional way and can be provided to the utility company 41 and the security unit 14 in a conventional manner. These keys can be constant or these keys can be session keys which are negotiated securely at the beginning of the session. In order to verify the authorization of the power meter, the utility company 41 sends a challenge to the security unit 14 via the network 31 and the control unit 20. The security unit 14 encrypts the challenge with the private key stored in the security unit 14 and forwards the encrypted challenge to the utility company 41. The utility company 41 decrypts the encrypted challenge using the public key stored in the utility company 41 and compares the decrypted response received from the security unit 14 with the challenge originally forwarded to the security unit 14. If the challenge originally forwarded to the security unit 14 corresponds to the decrypted response, the public key stored in the utility company 41 and the private key stored in the security unit 14 are corresponding keys. In this case, the power meter is considered to be an authorized power meter.

Figure 7:
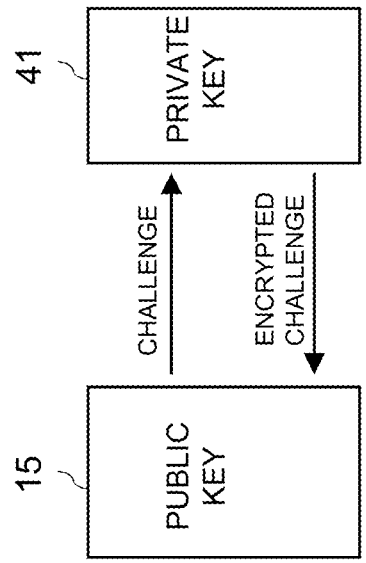
FIG. 7 illustrates one embodiment of a utility authentication method performed by the utility company and the security unit.

In an equivalent manner, the power meter, in particular the security unit 14 implemented in the power meter, can verify that the entity requesting consumption data from the power meter via the network 31 or forwarding control data to the power meter, like data for switching on or off the circuit breaker 16, is an authorized entity. An embodiment of a method enabling the security unit 14 to verify that the entity requesting data or forwarding control data, like the utility company 41, is an authorized entity, is illustrated in FIG. 7. In this method, the security unit 14 holds a public key and the utility model 41 holds the corresponding private key. For verification purposes, the security unit 14 via the control unit 20 and the network 31 forwards a challenge to the utility company 41. The utility company 41 encrypts the challenge using the private key and forwards a response to the security unit 14, wherein the response is the encrypted challenge. The security unit 14 decrypts the response received from the utility company 41 using the public key and compares the result of the decryption process with the challenge originally forwarded to the utility company 41. If the challenge corresponds to the decrypted response, the utility company 41 is considered to be authorized.

According to one embodiment, the power meter arrangements transmits power consumption data to the utility company 41 only after it has successfully been verified that the utility company 41 is authorized, using, for example, the method illustrated in FIG. 7. Further, the power meter is configured to accept requests from the utility company 41 to transmit power consumption data or to accept control data received from the utility company 41 only after it has been successfully verified that the utility company 41 is authorized, using, for example, the method illustrated in FIG. 6.

Additionally or alternatively to authenticating the power meter and the utility company 41, the communication between the utility company 41 and the power meter can be encrypted. This communication may include power consumption data transmitted from the power meter to the utility company 41, or may include data requests or control data transmitted from the utility company 41 to the power meter. Encrypting the communication between the power meter and the utility company 41 may include the use of a key pair with a public key and a private key, wherein one of the power meter and the utility company 41 encrypts the information to be transmitted using a public key, and the other one of the power meter and the utility model 41 decrypts the encrypted information using the corresponding private key. In the power meter, the key involved in this kind of communication can be stored in the security unit 14, which can be implemented as a hardware security module.

In the power meter, the encryption of data transmitted to the utility company 41 or the decryption of data or control information received from the utility company 41 is performed by the security unit 14. For this, the security unit 14 receives the data to be transmitted to the utility company 41, like data from the metrology unit 11, and encrypts these data before transmitting the data to the utility company 41 via the control unit 20 and the network. Likewise, the security unit 14 receives data or information transmitted by the control unit 20, decrypts these data or information and forwards the decrypted information to the respective units in the power meter, like the circuit breaker 16 or the metrology unit 11. Data received from the utility company 41 for the metrology unit 11 can be data which resets the metrology unit, for example, after the power consumption data have been read from the metrology unit 11 and forwarded to the utility company 41. Data or information received by the circuit breaker 16 are switching information which switch on or off the circuit breaker 16.

According to a further embodiment, the encryption and decryption of data to be transmitted or received, respectively, is not performed by the security unit 14, but is performed by the control unit 20. In this case, the security unit 14 (which can be implemented as a hardware security unit) stores the encryption/decryption keys required for the encryption/decryption process and provides these keys to the control unit 20.

The function of the security unit 14 is to provide a secure data communication between the power meter arrangement and the electricity company. "Secure data communication" in this connection means that data provided by the power meter arrangement, like power consumption data, are only disclosed to an authorized entity at the electricity company 41, and that external data, like control data for the circuit breaker 16 or software updates for the logic unit 21 are only accepted from the authorized entity at the electricity company. Further, the hardware security unit securely stores all the keys required in the power meter arrangement, like keys for communication and keys required for verifying the authentication of the software stored in the control unit 20. According to a further embodiment, the security unit 14 is configured to securely store measurement data or a history of measurement data provided by the metrology unit 11 (which can then be transmitted to utility company). According to yet another embodiment, the security unit 14 is also configured to store information on tampering attempts. Such tampering attempts may include the storing of non-authorized software in the control unit 20, wherein this type of tampering attempt can be detected using the method explained in detail hereinbefore. According to one embodiment, the metrology unit 11 is configured to receive tariff information. This tariff information can be used in the evaluation unit 13 to calculate the energy price based on the power consumption.

According to one embodiment, tariff information stored in the evaluation unit 13 can be provided to electrical loads via the logic unit 21 and a further network 32, like a home area network (HAN). These loads are further connected to the power line for power supply purposes. This tariff information in the electrical loads can, for example, be used to prevent the operation of electrical loads when, for example, the tariff is not a given tariff.

Referring to FIG. 5, the power meter arrangement may additionally include a power down control of a voltage supply circuit 17 connected to the power line 100 and configured to provide a supply voltage for the circuitry of the power meter arrangement. In order to avoid an unauthorized disabling of the power meter 10 by sending it to sleep mode through a command issued by the control unit 20, this function may also be managed through the security unit 14.

Besides the authentication and encryption/decryption functionality, the security unit 14 may store all secret keys for the different encryption purposes used in the system, like secret keys for authentication or encryption/decryption purposes; verify the integrity of the power meter by verifying certain behavior; or generate and evaluate certificates, to update secret keys or to implement additional security functions.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An electric power meter arrangement, comprising:
   a metrology unit that is configured to be coupled to a power line, to determine a power consumption, and to provide measurement data representing the power consumption;
   a programmable control unit including a memory that stores software configured to run on the control unit;
   a security unit coupled to the control unit by a communications link, the security unit configured to store at least one key and to determine whether the software stored in the memory of the programmable control unit has been altered without authorization; and
   a switching circuit comprising at least one switching element configured to be connected to the power line and configured to be switched on or off dependent on a drive signal received by the switching circuit, wherein the security unit is configured
      to receive drive information for the switching circuit from the control unit,
      to check a validity of the drive information, and
      to generate the drive signal dependent on the drive information only if the drive information has been determined to be valid.

2. The electric power meter arrangement of claim 1, wherein the at least one key comprises a secret key.

3. The electric power meter arrangement of claim 1, wherein the at least one key comprises a public key.

4. The power meter arrangement of claim 1, wherein the control unit further comprises:
   at least one first interface circuit which is configured to connect the control unit to a network.

5. The power meter arrangement of claim 1, further comprising a display coupled to the control unit.

6. The power meter arrangement of claim 1, wherein the control unit is configured to store measurement data.

7. The power meter arrangement of claim 6,
wherein the security unit is configured to read out stored measurement data upon receipt of a request from the control unit, and
wherein the security unit is configured to check a validity of the request, and to read out the measurement data only if the request has been determined to be valid.

8. The power meter arrangement of claim 1, wherein the security unit is further configured to store measurement data.

9. The power meter arrangement of claim 1, wherein the security unit is further configured to verify an integrity of the power meter arrangement by verifying certain behavior.

10. The power meter arrangement of claim 1, wherein the security unit is further configured to generate or evaluate certificates.

11. The power meter arrangement of claim 1, wherein at least one of the control unit and the security unit is configured to store at least one of tariff information, date information, and/or time information.

12. A method of monitoring power, the method comprising:
determining a power consumption of a power line by a metrology unit;
operating a control unit using software stored in memory of the control unit;
receiving data from the metrology unit by the control unit;
transmitting a key stored in a security unit to the control unit;
determining whether the software stored in the memory of the control unit has been tampered with using the key;
transmitting drive information for a switching circuit from the control unit to the security unit;
checking a validity of the drive information; and
generating a drive signal based on the drive information when the drive information is valid.

13. The method of claim 12, wherein determining whether the software stored in the memory of the control unit has been tampered with comprises:
retrieving an encrypted version of a checksum of the software stored in the memory of the control unit;
decrypting the checksum using a private key;
retrieving a public key;
applying a hash algorithm to the software stored in the memory of the control unit;
comparing a result of the hash algorithm to the checksum; and
deactivating the software if the result of the hash algorithm is unequal to the checksum.

14. The method of claim 12, further comprising preventing power from being transmitted by the power line when the software stored in the memory of the control unit has been tampered with.

15. The method of claim 12, further comprising:
transmitting data from the control unit to a utility company using a network;
transmitting software from the utility company to the control unit using the network; and
transmitting control information or control data from the utility company to the control unit.

16. The method of claim 12, further comprising powering down a voltage supply circuit connected to the power line when software stored in the memory of the control unit has been tampered with.

17. A system for monitoring a power line, the system comprising:
a metrology unit configured to be coupled to the power line, the metrology unit comprising
a sensing device configured to be coupled to the power line, and
an evaluation unit configured to calculate a power consumption based on an output of the sensing device and determine measurement data based on the power consumption;
a control unit configured to receive measurement data from the metrology unit and to transmit data to the metrology unit, the control unit comprising memory, the memory configured to store a software program, and
a first interface circuit configured to connect the control unit to a network;
a security unit coupled to the control unit, the security unit configured to detect whether the software stored in the memory of the control unit has been tampered with, and transmit a key stored in a security unit to the control unit; and
a switching circuit configured to be connected between two terminals of the power line, wherein the switching circuit coupled to the security unit, the switching circuit comprises at least one switching element configured to be connected to the power line and configured to be switched on or off dependent on a drive signal received by the switching circuit, and the security unit is configured
to receive drive information for the switching circuit from the control unit,
to check a validity of the drive information, and
to generate the drive signal dependent on the drive information only if the drive information has been determined to be valid.

* * * * *